United States Patent
Wu et al.

(10) Patent No.: US 7,212,787 B2
(45) Date of Patent: May 1, 2007

(54) WIRELESS AUDIO TRANSMISSION SYSTEM

(75) Inventors: Eric Wu, Hongkong (HK); So Yan Kwan, Hongkong (HK)

(73) Assignee: NASACO Electronics (Hong Kong) Ltd., Quarry Bay (HK)

( * ) Notice: Subject to any disclaimer, the term of this patent is extended or adjusted under 35 U.S.C. 154(b) by 738 days.

(21) Appl. No.: 09/998,676

(22) Filed: Nov. 29, 2001

(65) Prior Publication Data

US 2003/0100270 A1    May 29, 2003

(51) Int. Cl.
   *H04B 1/38*    (2006.01)
(52) U.S. Cl. .................... 455/73; 455/74.1; 455/78; 455/86; 455/87
(58) Field of Classification Search ............... 455/73, 455/74.1, 78, 86, 87, 88
   See application file for complete search history.

(56) References Cited

U.S. PATENT DOCUMENTS

| | | | | |
|---|---|---|---|---|
| 4,059,807 | A * | 11/1977 | Hamada | 330/10 |
| 5,175,877 | A * | 12/1992 | Streeter | 455/102 |
| 5,272,525 | A | 12/1993 | Borchardt et al. | 358/83 |
| 5,410,735 | A | 4/1995 | Borchardt et al. | 455/42 |
| 5,666,658 | A | 9/1997 | Borchardt et al. | 455/42 |
| 5,832,024 | A | 11/1998 | Schotz et al. | 375/200 |
| 6,038,255 | A * | 3/2000 | Palmer et al. | 375/238 |
| 6,212,359 | B1 | 4/2001 | Knox | 455/3.1 |
| 6,243,472 | B1 | 6/2001 | Bilan et al. | 381/117 |
| 6,256,482 | B1 | 7/2001 | Raab | 455/108 |
| 6,263,210 | B1 | 7/2001 | Takahashi | 455/464 |
| 6,459,458 | B1 * | 10/2002 | Balaban | 348/678 |
| 6,690,949 | B1 * | 2/2004 | Shamlou et al. | 455/557 |
| 7,010,271 | B2 * | 3/2006 | Melanson | 455/71 |
| 2002/0070799 | A1 * | 6/2002 | Dahan et al. | 330/10 |
| 2003/0017840 | A1 * | 1/2003 | Katagishi et al. | 455/550 |
| 2003/0064684 | A1 * | 4/2003 | Zinn | 455/73 |
| 2004/0100328 | A1 * | 5/2004 | Melanson | 330/297 |

* cited by examiner

*Primary Examiner*—Matthew D. Anderson
*Assistant Examiner*—Tuan Pham
(74) *Attorney, Agent, or Firm*—Saile Ackerman LLC; Stephen B. Ackerman; Billy Knowles

(57) ABSTRACT

A wireless audio transmission and reception system includes a pulse width amplifier, an up-converter, a transmitter, a receiver, a down-converter, an integrator, and a power amplifier to transfer an analog signal to a transducer such as a speaker. The pulse width amplifier receives an analog signal and modulates a pulse width of a timing signal with the analog signal. The pulse width of the timing signal is modulated such that the pulse width is proportional to the amplitude of the analog signal, and provides a pulse width modulated signal. The up-converter is in communication with the pulse width amplifier to receive the pulse width modulated signal and convert the pulse width modulated signal to a modulated carrier signal. The transmitter in communication with the up-converter to receive the modulated carrier signal and to transfer the modulated carrier signal wirelessly. The receiver receives the modulated carrier signal and transfers the modulated carrier signal to the down-converter that extracts the pulse width modulated signal from the modulated carrier signal. The down-converter transfers the extracted pulse width modulated signal to the integrator, which then restores the analog signal. The integrator transfers the recovered analog signal to the power amplifier for amplification and transfer to the transducer or speaker.

22 Claims, 4 Drawing Sheets

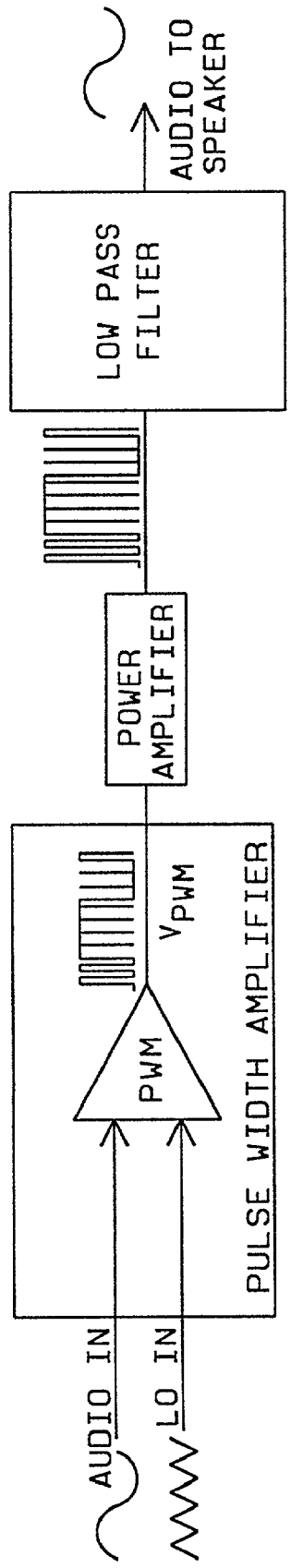
FIG. 1A – Prior Art
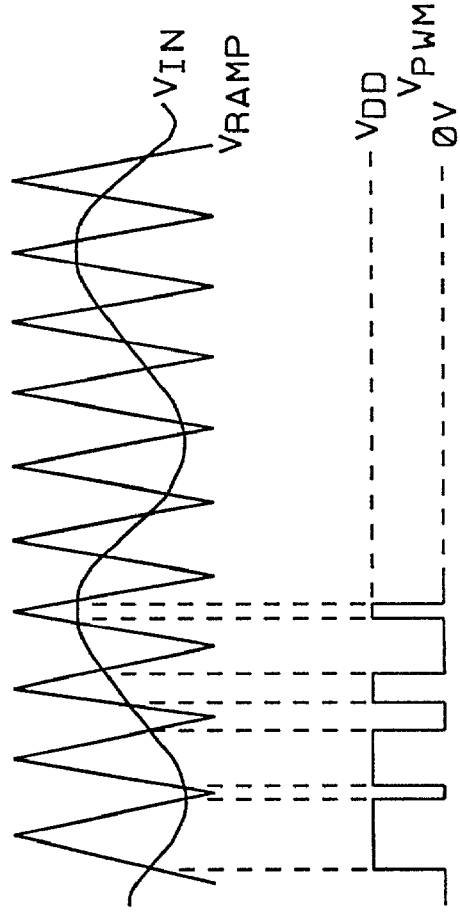
FIG. 1B – Prior Art

WIRELESS AUDIO TRANSMISSION SYSTEM

BACKGROUND OF THE INVENTION

1. Field of the Invention

This invention relates generally to the transmitting and receiving of analog signals wirelessly through the atmosphere. More particularly, the present invention relates to methods and circuits that modulate a timing signal with the analog signal, wirelessly transmit and receive the modulated signal, and restore the analog signals.

2. Description of Related Art

The wireless transmission of analog signals such as audio signals is well known in the art. Current commercially available devices such as cordless telephones and cellular telephones are examples of the wireless transmission and reception of audio frequency analog signals. U.S. Pat. No. 5,832,024 (Schotz et al.) illustrates the wireless transfer of audio frequency analog signals created by devices such as an AM/FM tuner to speakers. This wireless transfer is generally accomplished by modulating a radio frequency (RF) carrier signal with the analog signal.

The Federal Communication Commission (FCC) of the United States (U.S.) government strictly regulates the conditions at which information can be transmitted into the atmosphere. The FCC has allocated under 47 CFR§ 15.249 certain RF bands above 900 Mhz to be unlicensed. These bands generally require transmission of RF signals having less than 1 mW of power for signals with conventional modulation and 1 W of power for spread spectrum modulation. U.S. Pat. No. 5,272,525, U.S. Pat. No. 5,410,735, and U.S. Pat. No. 5,666,658, all to Borchardt et al., describe wireless audio systems that operate at frequencies greater than 900 MHz. U.S. Pat. No. 6,212,359 (Knox) describes a transmission system that receives digitized music from a receiver tuner employing the RF frequencies greater than 900 MHz, Class-D audio amplifiers, as is well known in the art, are commonly used to amplify audio signals for transfer to a speaker system. A class-D amplifier compares an input signal with a reference control the pulse-width of a digital signal. The Class-D amplifier creates an output signal having constant frequency and with a duty cycle that varies according to the input signal. A block diagram of the major components that make up the amplifier is shown in FIG. 1a. An audio analog input signal is applied to one input of a pulse width modulator and a reference control ramp signal LO in is applied to the other input. The pulse width modulator is essentially a comparator that compares the voltage level of the audio analog input signal with the reference control ramp signal and produces a digital output as shown in FIG. 1b. In this example, if the reference control ramp signal $V_{RAMP}$ is greater than the audio analog signal $V_{IN}$, the output $V_{PWM}$ of the pulse width modulator is at a high logic level ($V_{DD}$). Alternately, if the reference control ramp signal $V_{RAMP}$ is less than the audio analog signal $V_{IN}$, the output $V_{PWM}$ of the pulse width modulator is a low logic level (0V).

The output of the pulse width modulator is an input to a power amplifier. The power amplifier is driven such that it is either fully on or fully off thus minimizing the power dissipation of the amplifier when compared to a linear audio amplifier. The power being transferred directly to the load or speakers. The output of the power amplifier is the input to the low pass filter. The low pass filter is designed to remove the frequency content of the reference control ramp signal $V_{RAMP}$ from the signal to restore the audio analog signal. The output of the low pass filter is then transferred to the load of the speakers.

U.S. Pat. No. 6,243,472 (Bilan, et al.) describes a fully integrated, low cost, amplified electro-acoustic loudspeaker. The loudspeaker incorporates a Class-D amplifier circuit and a radio-frequency receiver amplifier circuit, directly mounted on the loudspeaker's magnetic assembly. The audio signals are digitally encoded using coding such as MP-3 and transmitted to the loudspeaker by wireless RF. The Class-D Amplifier receives the decoded audio signals and amplifies them to drive the speaker.

U.S. Pat. No. 6,256,482 (Raab) discloses a power-conserving drive-modulation method for envelope-elimination-and-restoration (EER) transmitters. The transmitter modulates an RF signal with the audio signal and employs a Class-D amplifier to transmit the modulated RF signal.

U.S. Pat. No. 6,263,210 (Takahashi) teaches a wireless communication system having multiple communication devices such as cordless phones. The wireless communication devices and the wireless control unit are capable of communicating using a spread spectrum frequency hopping method. The audio signals are digitally encoded for transfer between the communication devices and the wireless control unit.

SUMMARY OF THE INVENTION

An object of this invention is to provide a wireless transmission system to convey analog signals.

Another object of this invention is to provide a wireless reception system to accept wireless RF transmissions of analog signals.

Further another object of this invention is the wireless transmission and reception of analog signals within a local transmission area.

To accomplish at least one of these objects, a wireless audio transmission and reception system includes a pulse width amplifier, an up-converter, a transmitter, a receiver, a down-converter, an integrator, and a power amplifier to wirelessly transfer an analog signal to a transducer such as a speaker. The pulse width amplifier receives an analog signal, modulates a pulse width of a timing signal with the analog signal. The pulse width of the timing signal is modulated such that the pulse width is proportional to the amplitude of the analog signal, and provides a pulse width modulated signal. The up-converter is in communication with the pulse width amplifier to receive the pulse width modulated signal and convert the pulse width modulated signal to a modulated carrier signal. The transmitter in communication with the up-converter to receive the modulated carrier signal and to transfer the modulated carrier signal wirelessly.

The receiver receives the modulated carrier signal and transfers the modulated carrier signal to the down-converter and extracts the pulse width modulated signal from the modulated carrier signal. The down-converter transfers the extracted pulse width modulated signal to the integrator, which then restores the analog signal. The integrator transfers the recovered analog signal to the power amplifier for amplification and transfer to the transducer or speaker.

The pulse width amplifier is formed essentially of a comparator having a first input to receive the analog signal and a second input to receive the timing signal. The timing signal has a triangular form, such that as the comparator compares the analog signal and the timing signal, the pulse width modulated signal is created at an output of the comparator.

The up-converter comprises a modulation apparatus that combines a carrier frequency with the pulse width modulated signal to form the modulated carrier signal. The modulation apparatus is selected from a group of modulation apparatus consisting of frequency shift keying modulation apparatus, amplitude shift keying modulation apparatus, phase shift keying modulation apparatus, quadrature phase shift keying modulation apparatus, time domain multiple access modulation apparatus, and code domain multiple access modulation apparatus. Similarly, the down-converter comprises a demodulation apparatus to extract the pulse width modulated signal from the modulated carrier signal. The demodulation apparatus is selected from a group of demodulation apparatus consisting of frequency shift keying demodulation apparatus, amplitude shift keying demodulation apparatus, phase shift keying demodulation apparatus, quadrature phase shift keying demodulation apparatus, time domain multiple access demodulation apparatus, and code domain multiple access demodulation apparatus.

The integrator is a low pass filter having a cut off frequency suitable to pass the analog signal and remove the timing signal.

In the preferred embodiment the carrier frequency is at least 900 MHz.

Brief Description of the Drawings

FIG. 1a is a schematic diagram of a Class-D amplifier of the prior art.

FIG. 1b is a plot of the input and output waveforms of the Class-D amplifier illustrated in FIG. 1a.

DETAILED DESCRIPTION OF THE INVENTION

Figure 2:
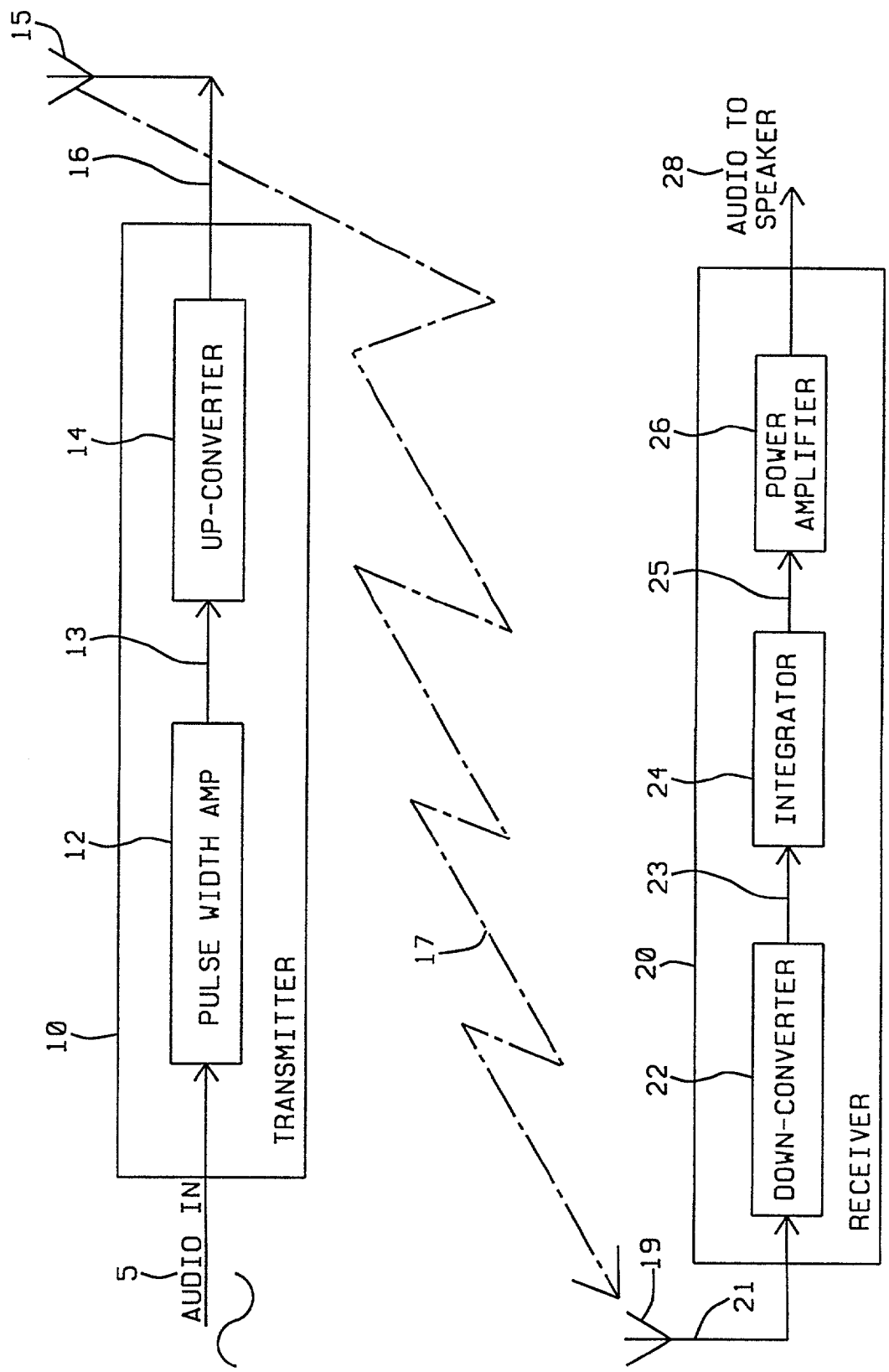
FIG. 2 is a block diagram of an analog transmission system of this invention.

The audio analog transmission and reception system of this invention, as shown in FIG. 2 has a transmitter 10 to receive an analog audio signal 5 modulate a timing signal to create a pulse width modulated digital signal 13. The pulse width modulated digital signal 13 is applied as an input to the up-converter circuit 14. The up-converter circuit 14 shifts the frequency of the pulse width modulated signal 13 to a much higher frequency to form the modulated carrier signal 16. The modulated carrier signal 16 is applied to the antenna 15 and is transmitted wirelessly 17 to the receiving antenna 19. The modulated carrier signal 21 as captured by the receiving antenna 19 is applied to the receiver 20. The receiver 20 has a down-converter, which acquires the received modulated carrier signal 21 and shifts the carrier frequency down so as to extract the pulse width modulated signal 23 from the received modulated carrier signal 21. The extracted pulse width modulated signal 23 is applied to the integrator 24 to reconstruct the analog audio signal 25. The analog audio signal 25 is amplified in the power amplifier 26 to created an amplified analog audio signal 28 to drive a transducer such as a speaker.

Figure 3:
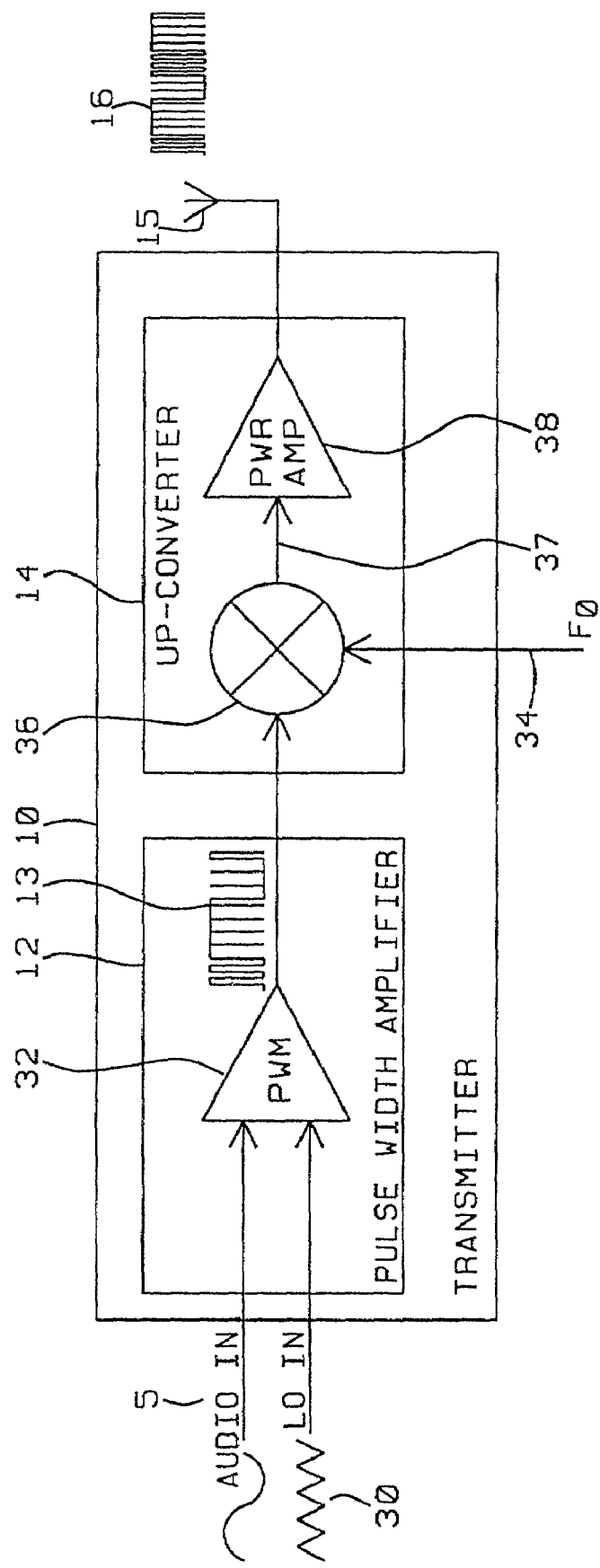
FIG. 3 is a block diagram of transmission system for transmitting an analog audio signal of this invention.

Refer now to FIG. 3 for a discussion of the transmitter system of this invention. The analog audio signal 5 and a local oscillator signal 30 are the inputs to the pulse width modulator 32. The pulse width amplifier 12 is fundamentally the class-D amplifier of FIG. 1a. The pulse width modulator 32 compares the analog input signal 5 to the local oscillator signal 30 to form the pulse width modulated signal 13. The local oscillator signal 30 is a ramp signal having the characteristics of $V_{RAMP}$ of FIG. 1b.

The pulse width modulated signal 13 is the input to the up-converter 14. The up-converter 14 has a multiplier circuit 36 that receives a carrier signal 34 or a signal having a frequency that is a multiple (sub-multiple) of the carrier frequency to be transmitted. The multiplier circuit 36 combines the pulse width modulated signal 13 and the carrier signal 34 to create the preamplified modulated carriers signal 37. The preamplified modulated carrier signal 37 is applied to the power amplifier 38 and sent to the antenna 15 as the modulated carrier signal 16 for transmission.

The multiplier 36 performs modulation of the carrier signal 34. The modulation of the carrier signal 34 includes such modulation techniques as frequency shift keying modulation, amplitude shift keying modulation, phase shift keying modulation, quadrature phase shift keying modulation, time domain multiple access modulation, and code domain multiple access modulation.

Figure 4:
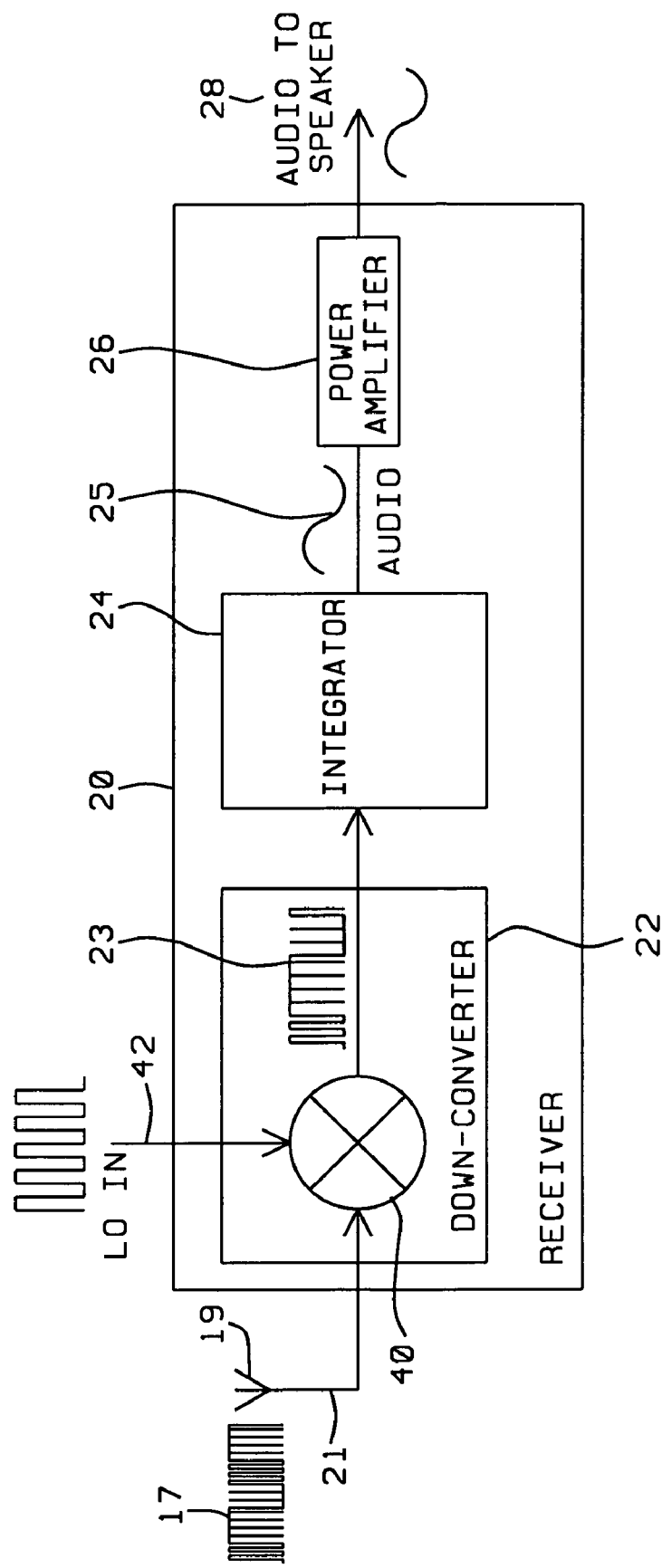
FIG. 4 is a block diagram of the receiving system for receiving an RF signal modulated with an analog audio signal of this invention.

The transmitted modulated carrier signal 17, as shown in FIG. 4, is received by the antenna 19. The received modulated carrier signal 21 is applied to the down-converter 22. The down-converter 22 consists essentially of a frequency multiplier 40 that removes the carrier signal from the received modulated carrier signal 21 to recover the pulse width modulated signal 23. The local oscillator frequency signal 42 is input to the frequency multiplier 40 to be combined with the received modulated carrier signals to create the recovered pulse width modulated signal 23.

The frequency multiplier 40 performs demodulation of the received modulated carrier signal 21. The demodulation of the carrier signal 34 includes such demodulation techniques as frequency shift keying demodulation, amplitude shift-keying demodulation, phase shift keying demodulation, quadrature phase shift keying demodulation, time domain multiple access demodulation, and code domain multiple access demodulation.

The recovered pulse width modulation signal 23 is the input to the integrator 24 to remove the timing signal and recover the analog audio signal 25. The integrator 24 is fundamentally a low pass filter that allows the full bandwidth of the analog audio signal to pass through but attenuates the high frequency content of the timing signal. Generally, the analog audio output 25 of the integrator 24 does not have sufficient magnitude to excite a transducer such as a speaker and thus must be passed through the power amplifier 26 to form the amplified audio signal 28 that is then transferred to the transducer (speaker).

In summary, the audio signal is combined (Class-D amplification) with a ramp timing signal to form a pulse width modulated signal. The pulse width modulated signal is then joined with the carrier signal to modulated the carrier signal to multiply the frequency of the timing signal to that of the carrier signal. The modulated signal is transmitted wirelessly and received and down-converted. The down-conversion consists of demodulating the received modulated carrier signal to recover the pulse width modulated signal. The pulse width modulated signal is then integrated to recover the analog signal, which is then amplified to drive a transducer such as a speaker.

While this invention has been particularly shown and described with reference to the preferred embodiments thereof, it will be understood by those skilled in the art that various changes in form and details may be made without departing from the spirit and scope of the invention.

The invention claimed is:

1. A wireless audio transmission and reception system comprising:
    a pulse width amplifier to receive an audio signal and a reference control ramp signal to compare said a voltage level of said audio signal with said reference control ramp signal to generate a digital output signal such that a pulse width of said digital output signal is modulated by said audio signal, such that the pulse width is proportional to an amplitude of said voltage level of said audio signal to provide a pulse width modulated signal;
    an up-converter in communication with the pulse width amplifier to receive the pulse width modulated signal and convert said pulse width modulated signal to a modulated carrier signal;
    a transmitter in communication with the modulated carrier signal to transfer the modulated carrier signal wirelessly;
    a receiver to receive the modulated carrier signal;
    a down-converter in communication with the receiver to receive the modulated carrier signal and combine said modulated carrier signal with a receiver local oscillator frequency signal to extract the pulse width modulated signal from the modulated carrier signal; and
    an integrator in communication with the down-converter to receive the extracted pulse width modulated signal to remove a timing signal from said extracted pulse width modulated signal to restore the audio signal.

2. The system of claim 1 further comprising power amplifier in communication with the integrator to receive the audio signal and amplify said audio signal and transfer said amplified audio signal to a transducer.

3. The system of claim 1 wherein the pulse width amplifier comprises
    a comparator having a first input to receive the audio signal and a second input to receive the reference control ramp signal, said reference control ramp signal having a triangular form such that, as said comparator compares the audio signal and the reference control ramp signal, the pulse width modulated signal is provided to an output of said comparator.

4. The system of claim 1 wherein the up-converter comprises a modulation apparatus to combine a carrier frequency with the pulse width modulated signal to form the modulated carrier signal.

5. The system of claim 4 wherein the modulation apparatus is selected from a group of modulation apparatus consisting of frequency shift keying modulation apparatus, amplitude shift keying modulation apparatus, phase shift keying modulation apparatus, quadrature phase shift keying modulation apparatus, time domain multiple access modulation apparatus, and code domain multiple access modulation apparatus.

6. The system of claim 1 wherein the down-converter comprises a demodulation apparatus to extract the pulse width modulated signal from the modulated carrier signal.

7. The system of claim 6 wherein the demodulation apparatus is selected from a group of demodulation apparatus consisting of frequency shift demodulation apparatus, amplitude shift keying demodulation apparatus, phase shift keying demodulation apparatus, quadrature phase shift keying demodulation apparatus, time domain multiple access demodulation apparatus, and code domain multiple access demodulation apparatus.

8. The system of claim 1 wherein the integrator is a low pass filter having a cut off frequency suitable to pass the audio signal and remove the timing signal.

9. The system of claim 1 wherein the carrier frequency is at least 900 MHz.

10. A wireless audio receiver system comprising:
    a receiver to receive a modulated carrier signal;
    a down-converter in communication with the receiver to receive the modulated carrier signal and combine said modulated carrier signal with a receiver local oscillator frequency signal to extract a pulse width modulated signal from the modulated carrier signal; and
    an integrator in communication with the down-converter to receive the extracted pulse width modulated signal to remove a timing signal from said extracted pulse width modulated signal to restore an audio signal.

11. The receiver system of claim 10 wherein the down-converter comprises a demodulation apparatus to extract the pulse width modulated signal from the modulated carrier signal.

12. The receiver system of claim 11 wherein the demodulation apparatus is selected from a group of demodulation apparatus consisting of frequency shift demodulation apparatus, amplitude shift keying demodulation apparatus, phase shift keying demodulation apparatus, quadrature phase shift keying demodulation apparatus, time domain multiple access demodulation apparatus, and code domain multiple access demodulation apparatus.

13. The receiver system of claim 10 wherein the integrator is a low pass filter having a cut off frequency suitable to pass the audio signal and remove the timing signal.

14. The receiver system of claim 10 wherein the carrier frequency is at least 900 MHz.

15. A method for wireless transmission of an audio signal comprising the steps of:
    acquiring the audio signal;
    comparing said audio signal with a reference control ramp signal;
    from said comparing, generating a digital output signal such that a pulse width of said digital output signal is modulated by said audio signal, such that the pulse width is proportional to an amplitude of said voltage level of said audio signal to provide a pulse width modulated signal;
    up-converting the pulse width modulated signal to a modulated carrier signal;
    transmitting said modulated carrier signal;
    receiving said modulated carrier signal;
    down-converting said modulated carrier signal to restore the pulse width modulated signal by the step of combining said modulated carrier signal with a receiver local oscillator frequency signal to extract the pulse width modulated signal from the modulated carrier signal; and
    integrating the restored pulse width modulated signal to remove a timing signal from said restored pulse width modulated signal to extract said audio signal.

16. The method of claim 15 further comprising the steps of:
    amplifying the restored audio signal transferring the amplified audio signal to a transducer.

17. The method of claim 15 wherein the comparing the audio signal to the timing signal and forming the pulse width modulated signal comprises the step of:

forming the reference control ramp signal to have a triangular waveform;

comparing the amplitude of the audio signal to the amplitude of the triangular waveform;

if the amplitude of the audio signal is greater than the amplitude of the timing signal, setting the pulse width modulated signal to a first logic level; and if the amplitude of the audio signal is less than the amplitude of the timing signal, setting the pulse width modulated signal to a second logic level.

18. The method of claim 15 wherein the up converting the pulse width modulating signal to the modulated carrier signal comprises the steps of combining a carrier frequency with the pulse width modulated signal to form the modulated carrier signal.

19. The method of claim 18 wherein the combining of the carrier frequency with the pulse width modulated signal is a modulating of the carrier frequency by the pulse width modulated signals, said modulating being selected from a group of modulating steps consisting of frequency shift keying modulating, amplitude shift keying modulating, phase shift keying modulating, quadrature phase shift keying modulating, time domain multiple access modulating, and code domain multiple access modulating.

20. The method of claim 18 wherein combining of local oscillator signal with the carrier frequency is a demodulating of the carrier frequency to extract the pulse width modulated signals, said demodulating being selected from a group of demodulating steps consisting of frequency shift keying demodulating, amplitude shift keying demodulating, phase shift keying demodulating, quadrature phase shift keying demodulating, time domain multiple access demodulating, and code domain multiple access demodulating.

21. The method of claim 15 wherein the down-converting said modulated carrier signal to restore the pulse width modulated signal comprises the step of:

combining a receiver local oscillator frequency signal with the modulated carrier signal to restore the pulse width modulated signal.

22. The method of claim 15 wherein the carrier signal is at least 900 MHz.

* * * * *